(12) United States Patent
de Boeij et al.

(10) Patent No.: US 12,717,239 B2
(45) Date of Patent: Aug. 25, 2026

(54) METHODS OF PATTERNING A PHOTORESIST, AND RELATED PATTERNING SYSTEMS

(71) Applicant: Liteq B.V., Eindhoven (NL)

(72) Inventors: Jeroen de Boeij, Eindhoven (NL); Mikhail Yurievich Loktev, Eindhoven (NL); Sylvain Misat, Eindhoven (NL)

(73) Assignee: Liteq B.V., Eindhoven (NL)

( * ) Notice: Subject to any disclaimer, the term of this patent is extended or adjusted under 35 U.S.C. 154(b) by 650 days.

(21) Appl. No.: 17/990,680

(22) Filed: Nov. 19, 2022

(65) Prior Publication Data

US 2023/0161263 A1 May 25, 2023

Related U.S. Application Data

(60) Provisional application No. 63/281,986, filed on Nov. 22, 2021.

(51) Int. Cl.
*G03F 7/00* (2006.01)

(52) U.S. Cl.
CPC ...... *G03F 7/70091* (2013.01); *G03F 7/70125* (2013.01); *G03F 7/70191* (2013.01)

(58) Field of Classification Search
CPC ............. G03F 7/70091; G03F 7/70125; G03F 7/70191; G03F 7/70075; G03F 7/70383; G03F 7/704; G03F 7/70466; G03F 7/70391; C25D 5/022; C25D 7/123
USPC .................. 438/266; 430/312, 313, 314, 333
See application file for complete search history.

(56) References Cited

U.S. PATENT DOCUMENTS

| | | | |
|---|---|---|---|
| 5,811,211 | A | 9/1998 | Tanaka et al. |
| 7,161,662 | B2 | 1/2007 | Ottens et al. |
| 7,713,663 | B2 | 5/2010 | Okubo et al. |
| 7,795,601 | B2 | 9/2010 | Lin et al. |
| 8,212,989 | B2 | 7/2012 | Thallner |
| 8,625,076 | B2 | 1/2014 | Chien et al. |
| 2002/0064729 | A1 | 5/2002 | Ching et al. |
| 2004/0004700 | A1 | 1/2004 | Park et al. |
| 2007/0196986 | A1 | 8/2007 | Ichige et al. |
| 2008/0252871 | A1 | 10/2008 | Sato et al. |
| 2009/0268184 | A1 | 10/2009 | Lin et al. |
| 2010/0248153 | A1 | 9/2010 | Lee et al. |
| 2012/0320359 | A1 | 12/2012 | Van Zwet et al. |
| 2013/0292162 | A1 | 11/2013 | Lee et al. |
| 2013/0293861 | A1 | 11/2013 | Deguenther |
| 2024/0319615 | A1 | 9/2024 | Best et al. |

FOREIGN PATENT DOCUMENTS

| | | | |
|---|---|---|---|
| CN | 107102515 | B | 6/2020 |
| JP | H06283406 | A | 10/1994 |
| JP | 2000091184 | A | 3/2000 |

(Continued)

OTHER PUBLICATIONS

International Search Report for PCT Application No. PCTEP2022/082809 completed Mar. 14, 2023.

(Continued)

*Primary Examiner* — Caleen O Sullivan
(74) *Attorney, Agent, or Firm* — Schwegman Lundberg & Woessner, P.A.

(57) ABSTRACT

According to an exemplary embodiment of the invention, a method of patterning a photoresist is provided. The method includes selectively illuminating an edge portion of a photoresist using an illumination system to form a patterned portion of the photoresist.

32 Claims, 21 Drawing Sheets

(56) References Cited

FOREIGN PATENT DOCUMENTS

| | | | |
|---|---|---|---|
| JP | 2007194583 | A | 8/2007 |
| JP | 2013232576 | A1 | 8/2007 |
| JP | 4495019 | B2 | 4/2010 |
| KR | 20090044523 | A | 5/2009 |
| KR | 20150005522 | A | 1/2015 |
| KR | 20160103927 | A | 9/2016 |
| WO | WO-2023089197 | A1 | 5/2023 |

OTHER PUBLICATIONS

"U.S. Appl. No. 18/398,919, Non Final Office Action mailed Jun. 12, 2025", 7 pgs.
"International Application Serial No. PCT/US2024/019734, International Search Report mailed Jul. 18, 2024", 4 pgs.
"International Application Serial No. PCT/US2024/019734, Written Opinion mailed Jul. 18, 2024", 5 pgs.
"Taiwanese Application Serial No. 113109945, Office Action mailed Oct. 14, 2024", with English claims, 13 pages.
"Taiwanese Application Serial No. 113109945, Response filed Jan. 13, 2025 to Office Action mailed Oct. 14, 2024", with English claims, 11 pages.
Baek, Seunghwa, et al., "Resolution enhancement using plasmonic metamask for wafer-scale photolithography in the far field", Scientific Reports vol. 6 Article No. 30476, (Jul. 26, 2016), 8 pages.

GROW CONDUCTORS
250b
114
114a
102a1'
114b
102b1'
102b1'
104
102b
102a
102
124
128
222b

METHODS OF PATTERNING A PHOTORESIST, AND RELATED PATTERNING SYSTEMS

CROSS-REFERENCE TO RELATED APPLICATION

This application claims the benefit of U.S. Provisional Application No. 63/281,986, filed on Nov. 22, 2021, the content of which is incorporated herein by reference.

FIELD

The invention relates to lithographic systems, and more particularly, to systems for, and methods of, patterning a photoresist.

BACKGROUND

In microelectronic processes, where lithographic patterning of a photoresist is used in combination with electroplating, the electroplating tends to yield non-uniform thickness of conductive structures. Specifically, the thickness (or other dimension) of such electroplated conductive structures tend to gradually increase towards the edge of the substrate. As a result, dummy patterns are sometimes created at the edge of the substrate.

Thus, it would be desirable to provide improved methods of patterning a photoresist, and related patterning systems.

SUMMARY

According to an exemplary embodiment of the invention, a method of patterning a photoresist is provided. The method includes selectively illuminating an edge portion of a photoresist using an illumination system to form a patterned portion of the photoresist.

According to another exemplary embodiment of the invention, another method of patterning a photoresist is provided. The method includes the steps of: (a) patterning a first portion of a photoresist to form a first patterned portion of the photoresist, the first patterned portion corresponding to an active area of a semiconductor element; and (b) selectively illuminating a second portion of the photoresist using an illumination system to form a second patterned portion of the photoresist, the second patterned portion corresponding to an inactive area of the semiconductor element.

According to yet another exemplary embodiment of the invention, yet another method of patterning a photoresist is provided. The method includes the steps of: (a) patterning a first portion of the photoresist to form a first patterned portion of the photoresist, the first patterned portion including first patterned features having a dimension of less than 10 microns; and (b) selectively illuminating a second portion of the photoresist using an illumination system to form a second patterned portion of the photoresist, the second patterned portion including second patterned features having a dimension of greater than 10 microns (or greater than 20 microns, or greater than 50 microns). As will be appreciated by those skilled in the art, these dimensions are in a lateral direction (e.g., a width of the patterned feature, a length of a patterned feature, a length and width of a patterned feature, etc.), as opposed to being in a vertical direction (e.g., a depth of the patterned feature).

According to an exemplary embodiment of the invention, a patterning system is provided. The patterning system includes a support structure for supporting a photoresist. The patterning system also includes an illumination system configured to selectively illuminate an edge portion of the photoresist to form an edge patterned portion of the photoresist.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Figure 1A:
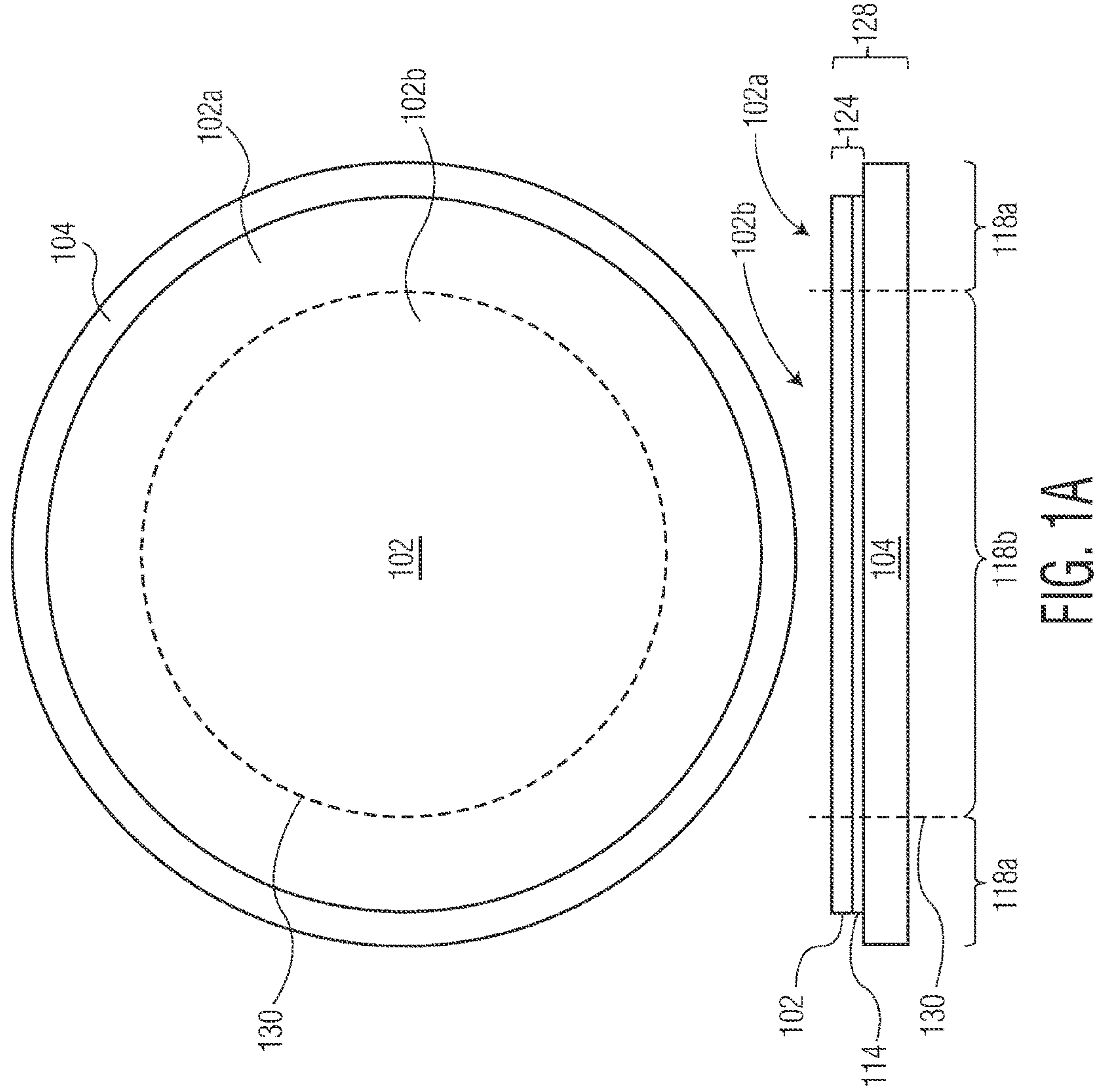
FIGS. 1A-1B each include side and top views of workpiece assemblies useful for explaining various exemplary embodiments of the invention.

As used herein, the term “spot light beam” is intended to be broadly construed, and shall not be limited to any specific shape or configuration. Thus, a spot light beam is not limited to a “round” configuration.

As used herein, a “substrate” may refer to any type of substrate, for example, a semiconductor wafer, a panel, a tray, an insulative substrate, a semiconductor element, a plurality of semiconductor elements, etc. In some embodiments (e.g., when the substrate is an insulative substrate), a “seed layer” (i.e., a conductive layer from which conductive structures will be grown) may be utilized.

As used herein, a "a semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a panel, a BGA substrate, a semiconductor element, etc.), a semiconductor wafer, a packaged semiconductor device, a flip chip semiconductor device, a die embedded in a substrate, a stack of semiconductor dies, amongst others.

As provided above, exemplary semiconductor elements are semiconductor wafers, panels, or other structures including a plurality of semiconductor die. As will be understood by those skilled in the art, an "active area" of a semiconductor element is that portion configured to be later used in the manufacturing of semiconductors devices. For example, in a semiconductor wafer (or panel), the active area may refer to the portion including a plurality of semiconductor die to be used to make semiconductor devices. In contrast, the "inactive area" of a semiconductor element is that portion that will not be used later in the manufacturing of semiconductors devices (e.g., the portion that will be discarded).

Throughout this document, like reference numerals refer to like elements unless indicated otherwise. Thus, the description of certain elements is omitted in connection with certain drawings to avoid duplication.

According to certain exemplary embodiments of the invention, methods of patterning an edge portion of a photoresist are provided (e.g., fast direct-write patterning). With dedicated methods for fast patterning of edge portions of photoresists, production of electroplated layers is improved in terms of thickness uniformity and processing speed. The fill factor (wherein the fill factor refers to a portion of an area covered by conductors—see FIGS. 6B-6D) can be optimized to improve the thickness uniformity for a particular product pattern. Another new feature is tunability of a generic edge pattern; this provides an additional degree of freedom for minimizing thickness variation. Using such methods, a generic pattern with an adjustable fill factor may be provided.

Various schemes for patterning the edge portion of the photoresist are described herein, including, for example: a scanning scheme, where illumination from a light source is focused on a single spot; illumination is split into multiple spots to be exposed in parallel; a multi-spot scanning scheme based on an active element (e.g., spatial light modulator) in combination with a projection optical system; among others. Proposed embodiments can be implemented using a standalone edge processing tool or as an additional subsystem in a general-purpose lithography tool.

Through various embodiments of the invention, fast exposure processes resulting in improved thickness uniformity of patterned layers (e.g., made by electroplating) are provided. Such exposure processes may be useful in microelectronic production, for example, for making redistribution and contact layers.

In accordance with certain exemplary aspects of the invention, a plurality of spot light beams are created for patterning an edge portion of a photoresist. The plurality of spot light beams may be provided using at least one of an active optical assembly (e.g., including a spatial light modulator in combination with a projection optical system) or a passive optical assembly (e.g., including a diffractive optical element) of the illumination system.

Referring now to the drawings, FIG. 1A illustrates a side view and a top view of a workpiece assembly 128. Workpiece assembly 128 includes a workpiece 124 and a substrate 104 (e.g., a semiconductor wafer, etc.). Workpiece 124 includes a seed layer 114 and a photoresist 102 (which is provided on seed layer 114). Photoresist 102 includes an edge portion **102*a* and an inner portion 102*b*. A delineation mark 130 is illustrated with a dotted line to denote the approximate distinction between edge portion 102*a* and inner portion 102*b*. Delineation mark 130 also denotes the approximate distinction between a region 118*a* (i.e., a region corresponding to an inactive area of a semiconductor element) and a region 118*b* (i.e., a region corresponding to an active area of a semiconductor element). That is, at some point in the future (after further processing) region 118*a* will include one or more active semiconductor elements, and region 118*b*** will not include active semiconductor elements.

Figure 1B:
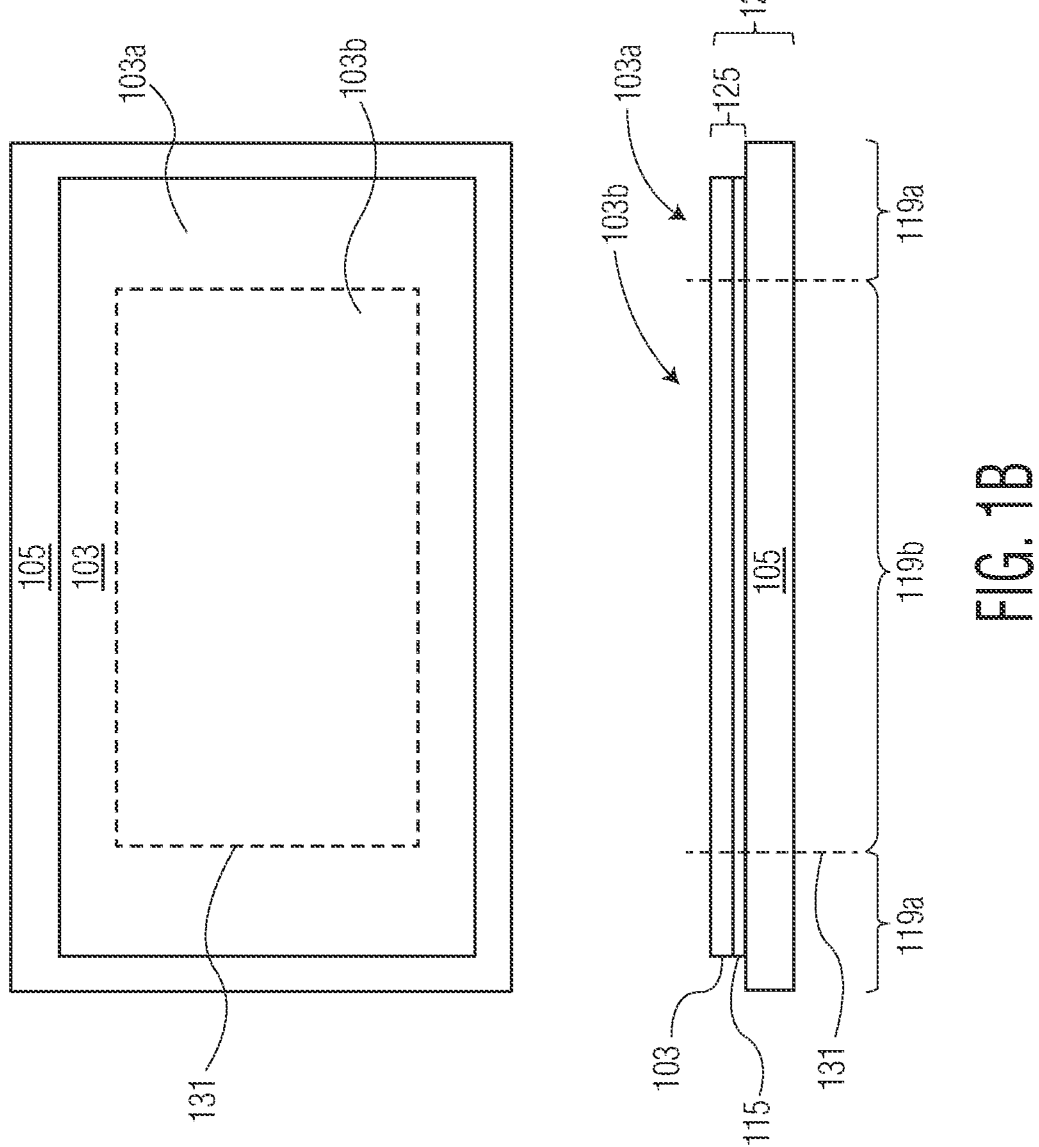

Referring now to FIG. 1B, a side view and a top view of a workpiece assembly 129 is illustrated. Workpiece assembly 129 is similar in many ways to workpiece assembly 128, except the workpiece assembly 129 is substantially rectangular (e.g., a panel configuration, a square panel configuration, etc.) whereas workpiece assembly 128 is substantially circular (e.g., a wafer configuration). Workpiece assembly 129 includes a workpiece 125 and a substrate 105. Workpiece 125 includes a seed layer 115 and a photoresist 103 (which is provided on seed layer 115). Photoresist 103 includes an edge portion **103*a* and an inner portion 103*b*. A delineation mark 131 is illustrated with a dotted line to denote the approximate distinction between edge portion 103*a* and inner portion 103*b*. Delineation mark 131 also denotes the approximate distinction between a region 119*a* (i.e., a region corresponding to an inactive area of a semiconductor element) and a region 119*b*** (i.e., a region corresponding to an active area of a semiconductor element).

Figure 2A:
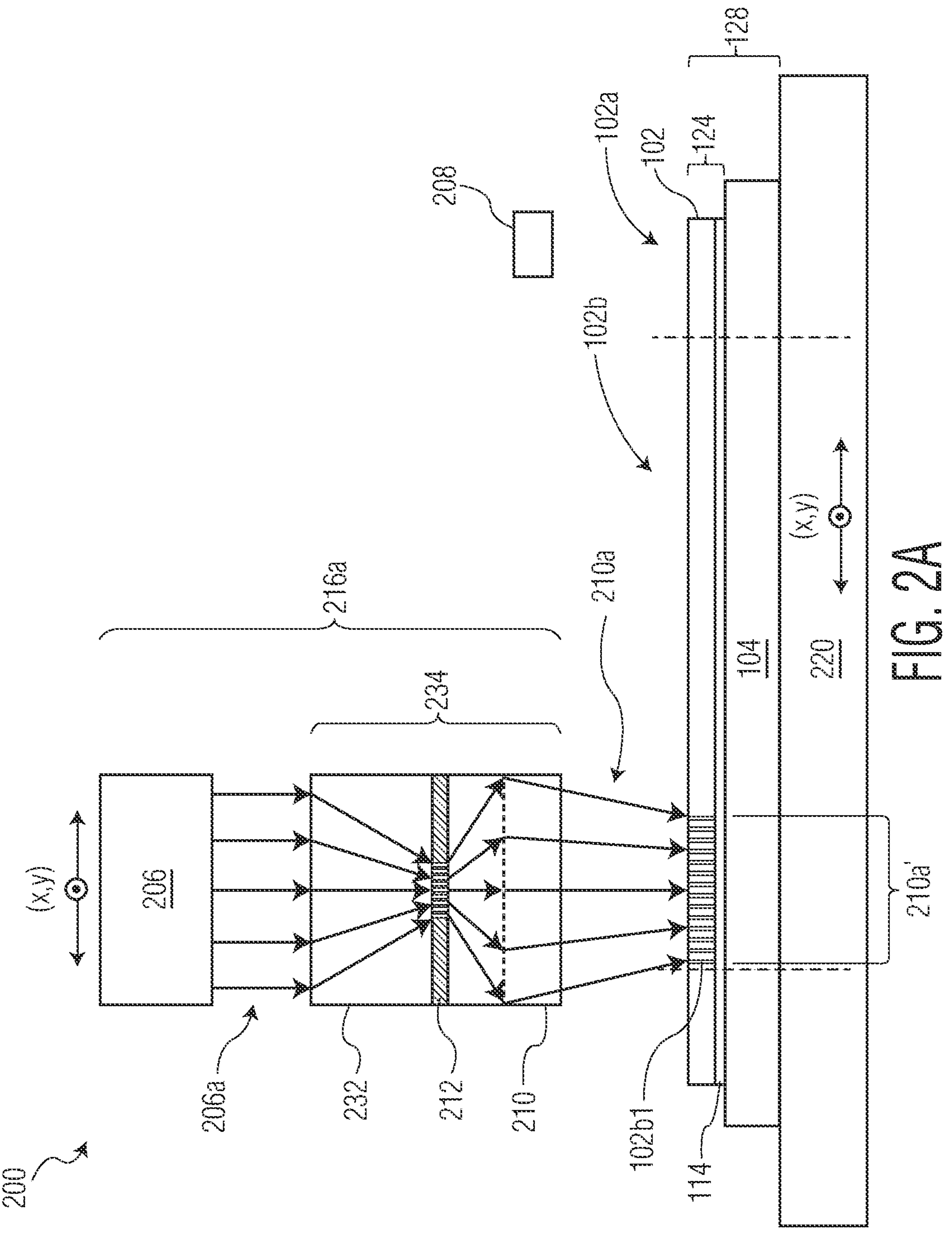
FIGS. 2A-2D are a series of block diagram side sectional views of a patterning system illustrating a method of patterning a photoresist in accordance with an exemplary embodiment of the invention.

Referring now to FIGS. 2A-2D, a patterning system 200 is illustrated illuminating a workpiece 124 (e.g., workpiece 124 from FIG. 1A). FIGS. 2A-2D illustrate a "projection litho stepper" system; however, it is understood that this aspect of the invention is not limited to such a system, for example, this system could be a "litho scanner" (where both reticle and substrate move), a "litho direct write" (LDI) (which writes high resolution features with one or more focused beams), or another type of system within the scope of the invention. Referring specifically to FIG. 2A, patterning system 200 includes a support structure 220 for supporting workpiece assembly 128 (including workpiece 124 and substrate 104). Support structure 220 is capable of moving in a horizontal x and/or y direction. Patterning system 200 also includes an illumination system **216*a* that is capable of moving in a horizontal x and/or y direction. Illumination system 216*a* includes a light source 206 and an optical assembly 234. Optical assembly 234 includes illumination optics system 232, a photomask 212 (e.g., a reticle), and a projection optics system 210. Finally, patterning system 200 includes an optical assembly 208 that is provided between support structure 220 and light source 206** and is capable of moving in a horizontal x and/or y direction.

Figure 2B:
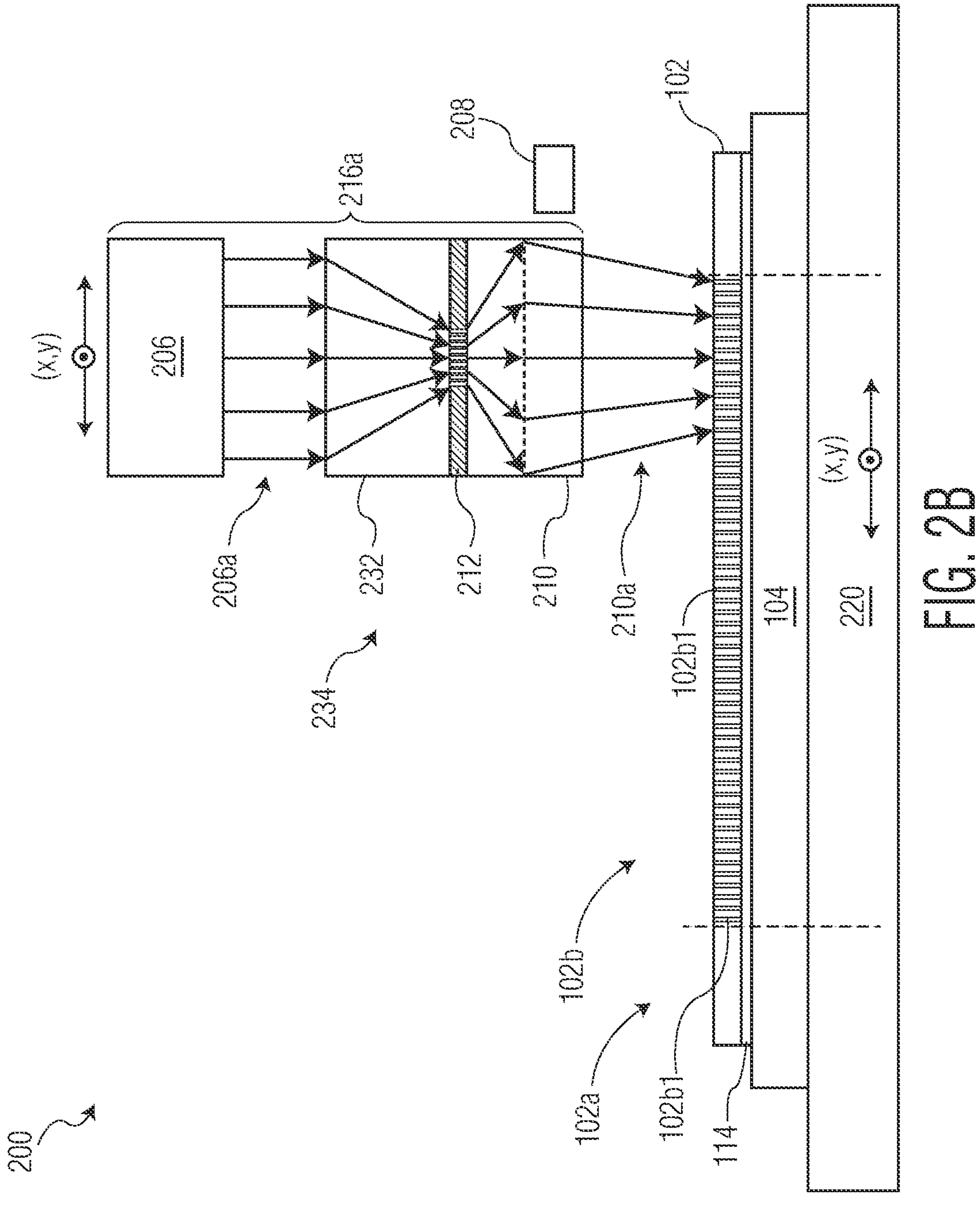

Light source 206 is illustrated providing light **206*a* to illumination optics system 232 of optical assembly 234. Light 206*a* is transmitted through photomask 212 to create a pattern. Light 210*a* (i.e., inner patterning light) is illustrated projected through projection optics system 210, where light 210*a* is expanded and/or narrowed before illuminating a region of photoresist 102 (e.g., inner portion 102*b*). Optical assembly 234 illuminates an illumination region 210*a*' with light 210*a*, where an inner patterned portion 102*b*1 is thus formed. In FIG. 2B, illumination system 216*a* has been moved along a horizontal axis (e.g., x-axis) while illuminating inner region 102***b* to form inner patterned portion 102*b*1, thus patterning the entire inner region 102*b*.

Figure 2C:
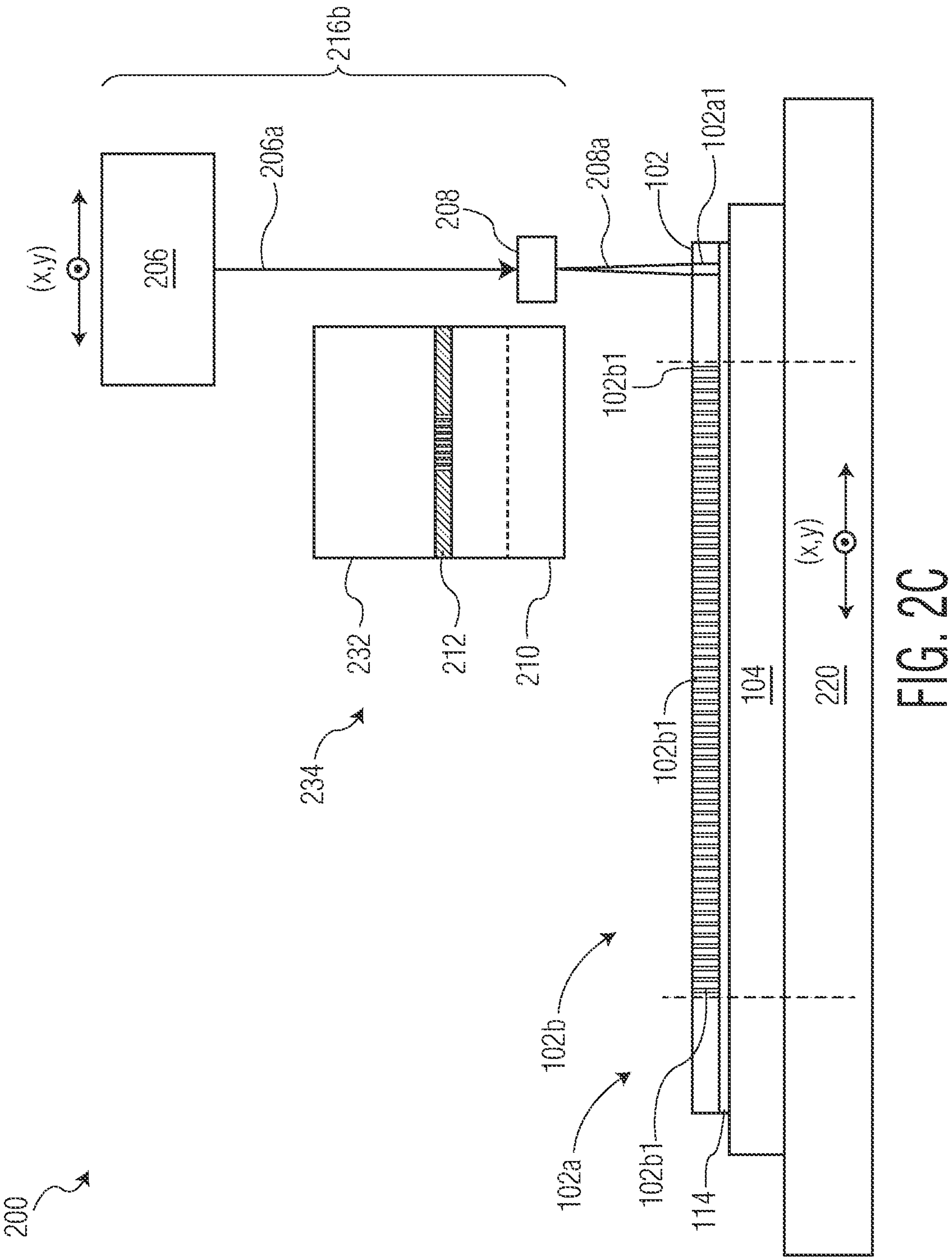
Figure 2D:
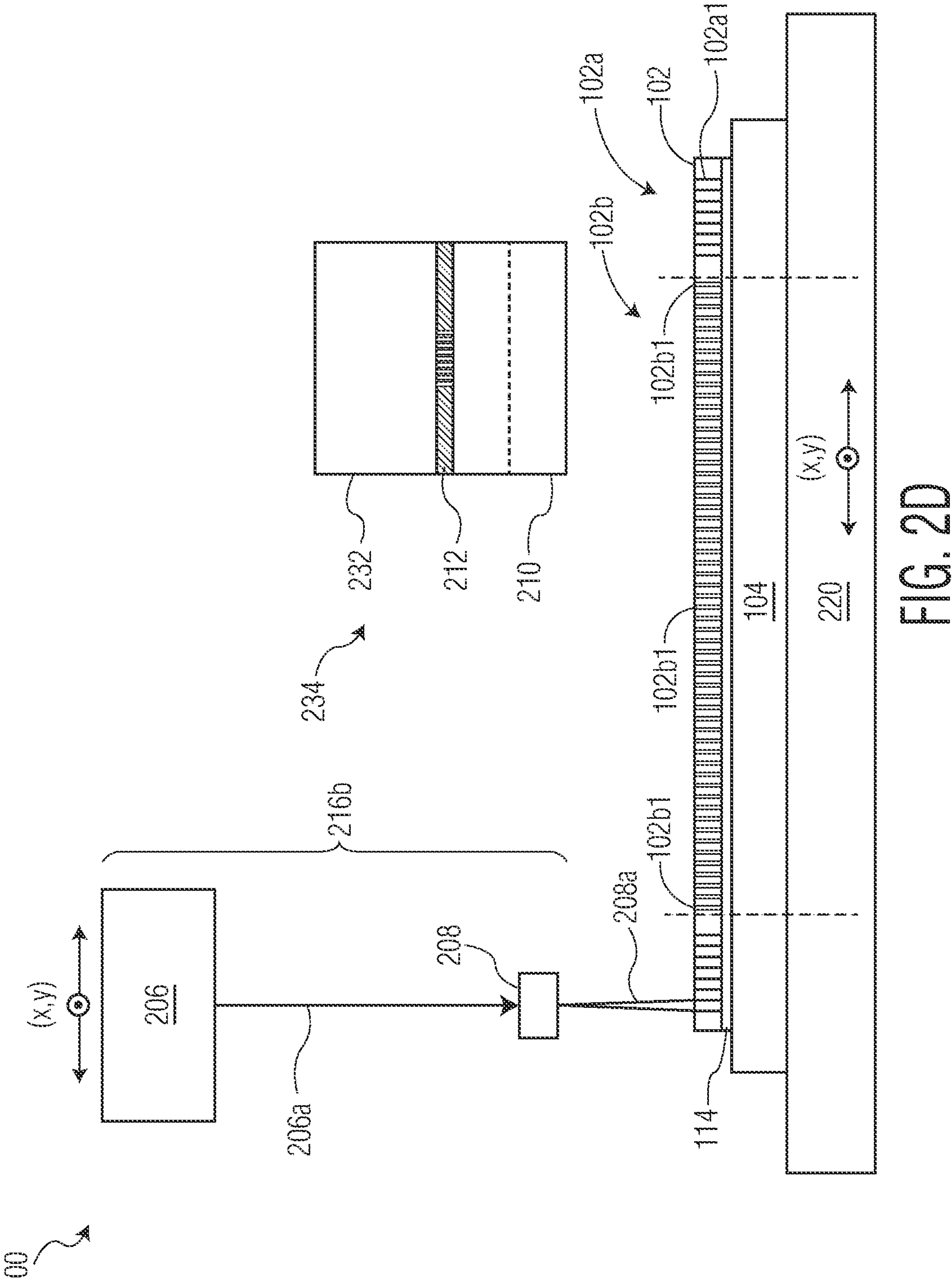

In FIG. 2C, light source 206 has been moved to a position above optical assembly 208 to form illumination system 216*b*. Illumination system 216*b* is positioned above edge portion 102*a* of photoresist 102. Light source 206 is illustrated transmitting light 206*a* to optical assembly 208. Illumination system 216*b* is illustrated selectively illuminating edge portion 102*a*. Illumination system 216*b* is transmitting a beam 208*a* (e.g., a spot light beam) to edge portion 102*a* of photoresist 102, thus forming patterned portion 102*a*1. In FIG. 2D, illumination system 216*b* is positioned above another part of edge portion 102*a* of photoresist 102 to selectively illuminate another part of edge portion 102*a*. Illumination system 216*b* is illustrated transmitting another beam 208*a* to another edge portion 102*a* of photoresist 102, thus forming another patterned portion 102*a*1. Thus, illumination system provides a spot light beam which is selectively turned on and off at different locations of edge portion 102*a* to form the edge patterned portion of photoresist 102.

Although light source 206, optical assembly 234, optical assembly 208, illumination system 216*a*, and/or illumination system 216*b* are illustrated moving along a horizontal axis (e.g., x-axis, y-axis, etc.), the invention is not so limited. For example, support structure 220 may be moved to achieve a desired relative movement. Other configurations are contemplated.

Figure 2E:
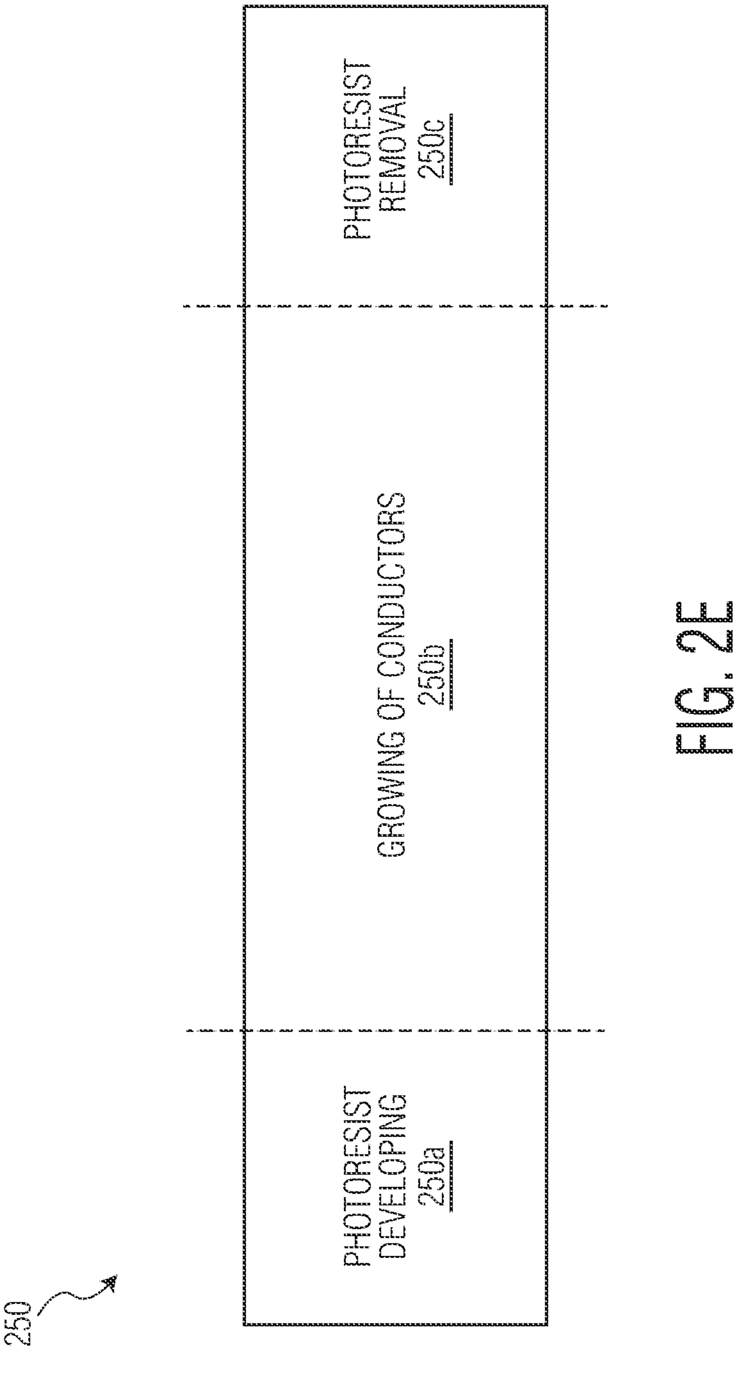
FIG. 2E is a block diagram representation of a system for processing a photoresist to form conductive structures in accordance with an exemplary embodiment of the invention.
Figure 2F:
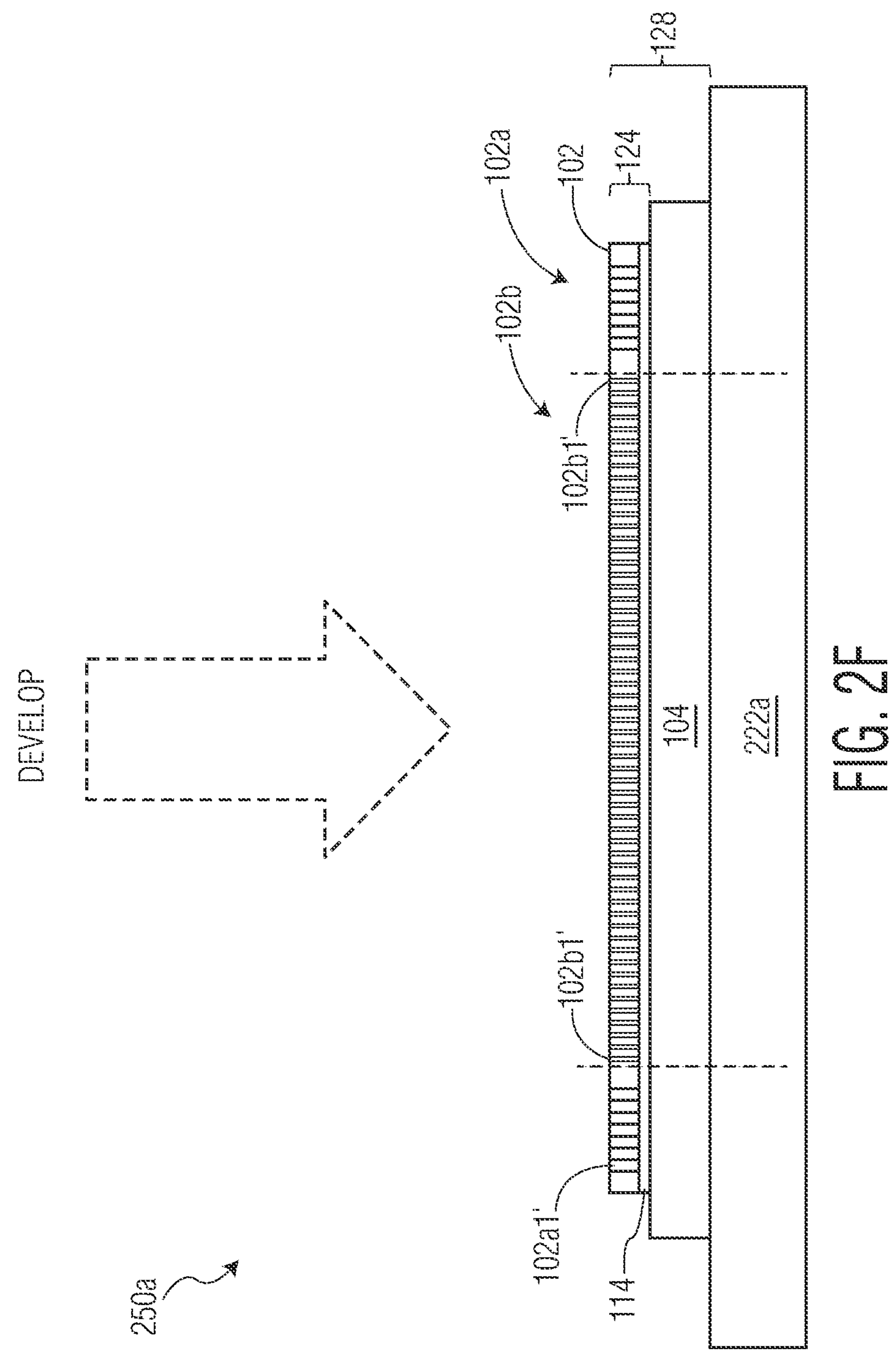
FIGS. 2F-2H are a series of block diagram side sectional views of portions of the system of FIG. 2E.

Referring now to FIG. 2E, a block diagram representation of a system 250 for processing a photoresist to form conductive structures is illustrated. System 250 includes a photoresist development stage 250*a*, a growth of conductors (e.g., conductive structures) stage 250*b*, and a photoresist removal stage 250*c*. Referring now to FIG. 2F, workpiece 124 is illustrated being developed in the photoresist development stage 250*a*. Workpiece assembly 128 is supported by support structure 222*a*. For example, a photoresist developer solvent may be used to wash away soluble photoresist of patterned portions 102*a*1 and 102*b*1, thus creating apertures 102*a*1' and 102*b*1' in the edge portion 102*a* and inner portion 102*b*, respectively.

Figure 2G:
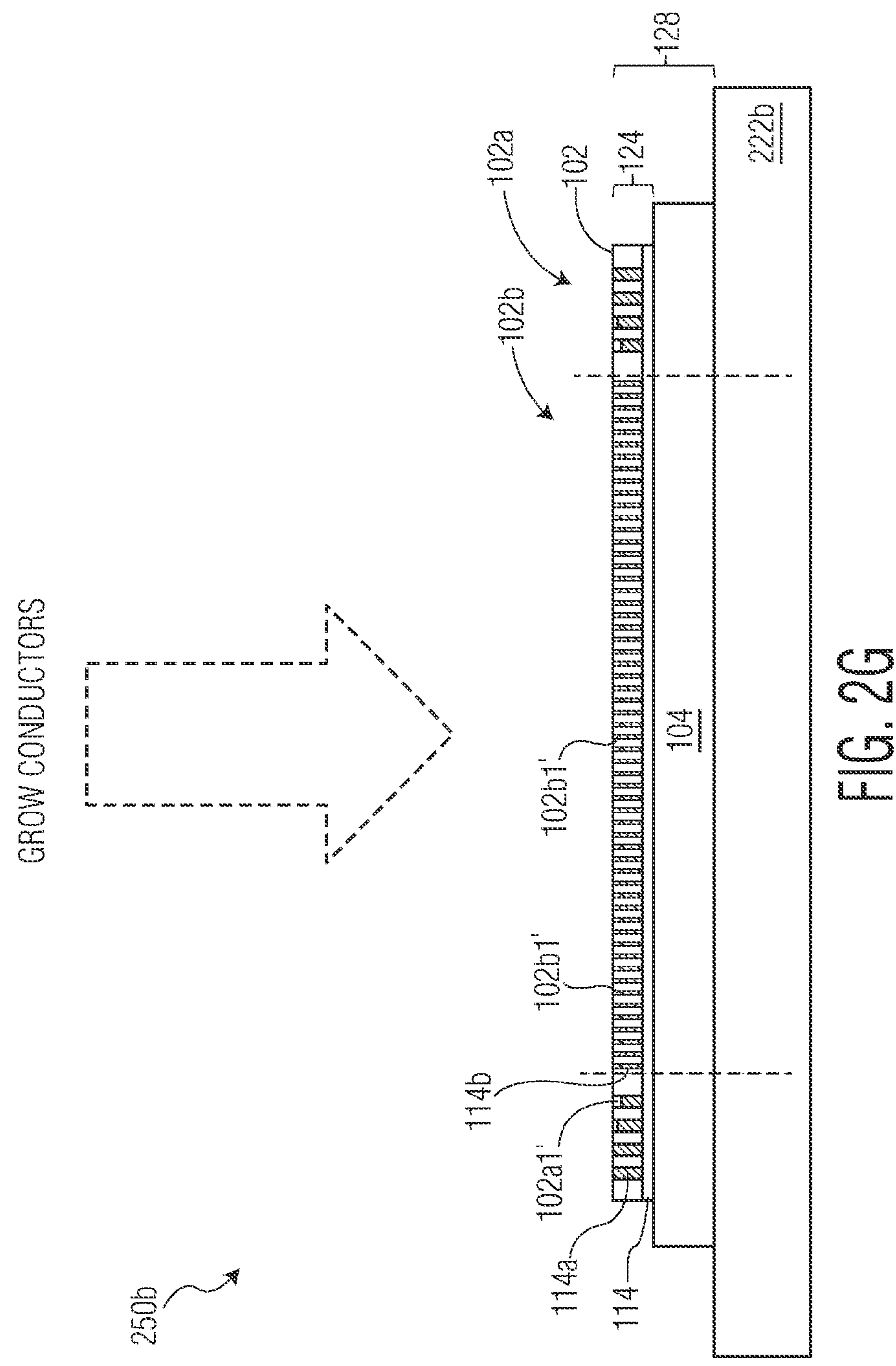

In FIG. 2G, workpiece 124 is illustrated being processed in a growth of conductors stage 250*b* (e.g., using electroplating or the like). Workpiece assembly 128 is supported by support structure 222*b* (which may be the same support structure 222*a* or a different support structure). As illustrated, electroplating is applied to workpiece assembly 128, thus growing a plurality of conductive structures 114*a* in an edge portion 102*a* of photoresist 102. Simultaneously, a plurality of conductive structures 114*b* are grown in an inner portion 102*b* of photoresist 102. As illustrated, conductive structures 114*a* may be taller than conductive structures 114*b*.

Figure 2H:
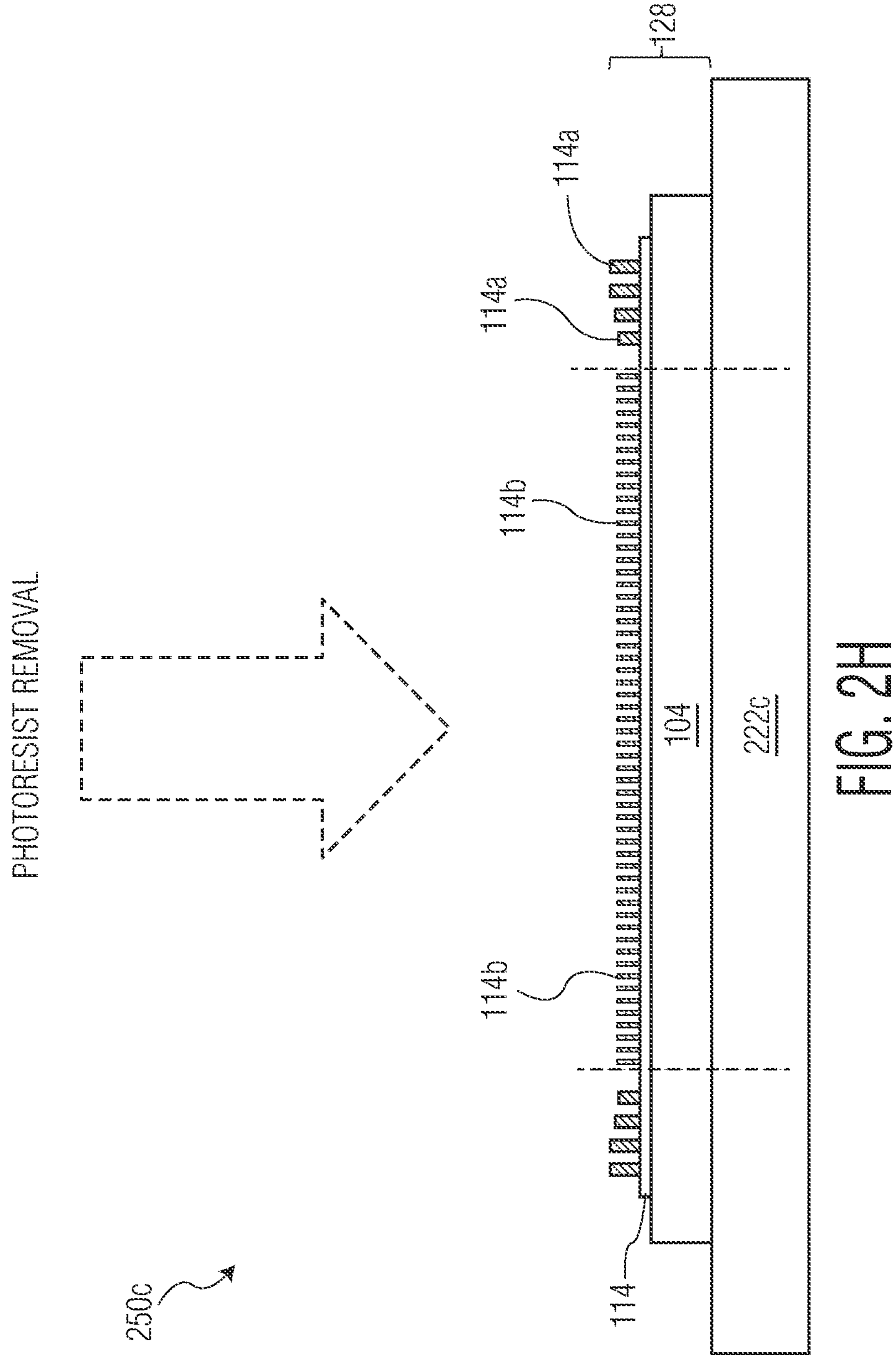

In FIG. 2H, photoresist 102 (from FIG. 2G) is illustrated having been removed in a photoresist removal stage 250*c*. Workpiece assembly 128 is supported by support structure 222*c* (which may be the same support structure 222*a*, support structure 222*b*, or a different support structure). A photoresist removal material (e.g., a liquid resist stripper, etc.) is applied to photoresist 102 (from FIG. 2G) to expose the plurality of conductive structures 114*a* and 114*b*. Certain steps may be taken which are omitted from these illustrations for simplicity and clarity (such as etching away undesired portions of seed layer 114, substrate 104, etc.).

Figure 3:
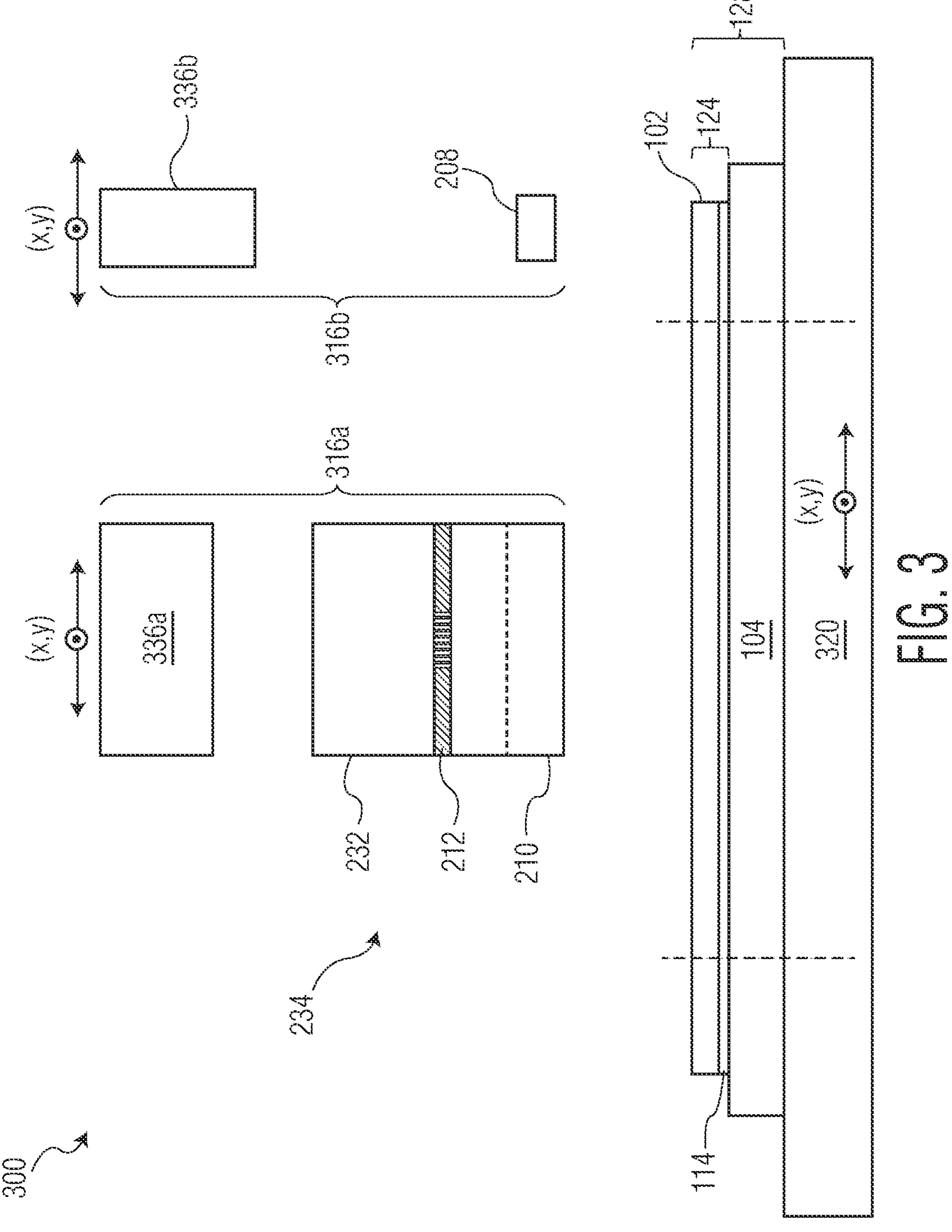
FIG. 3 is a block diagram side sectional view of a patterning system including a plurality of light sources in accordance with an exemplary embodiment of the invention.

As described above in connection with FIGS. 2A-2D, two illumination sources 216*a* and 216*b* each include a common light source 206. However, the respective illumination systems may include separate light sources (e.g., a first illumination system may include a first light source, and a second illumination system may include a second light source). Referring now to FIG. 3, patterning system 300 is illustrated having illumination system 316*a* including light source 336*a*, and illumination system 316*b* including light source 336*b*. Workpiece assembly 128 is supported by support structure 320 (which may be the same support structure 220, or a different support structure). Other elements in FIG. 3 are the same as in FIGS. 2A-2D.

Figure 4:
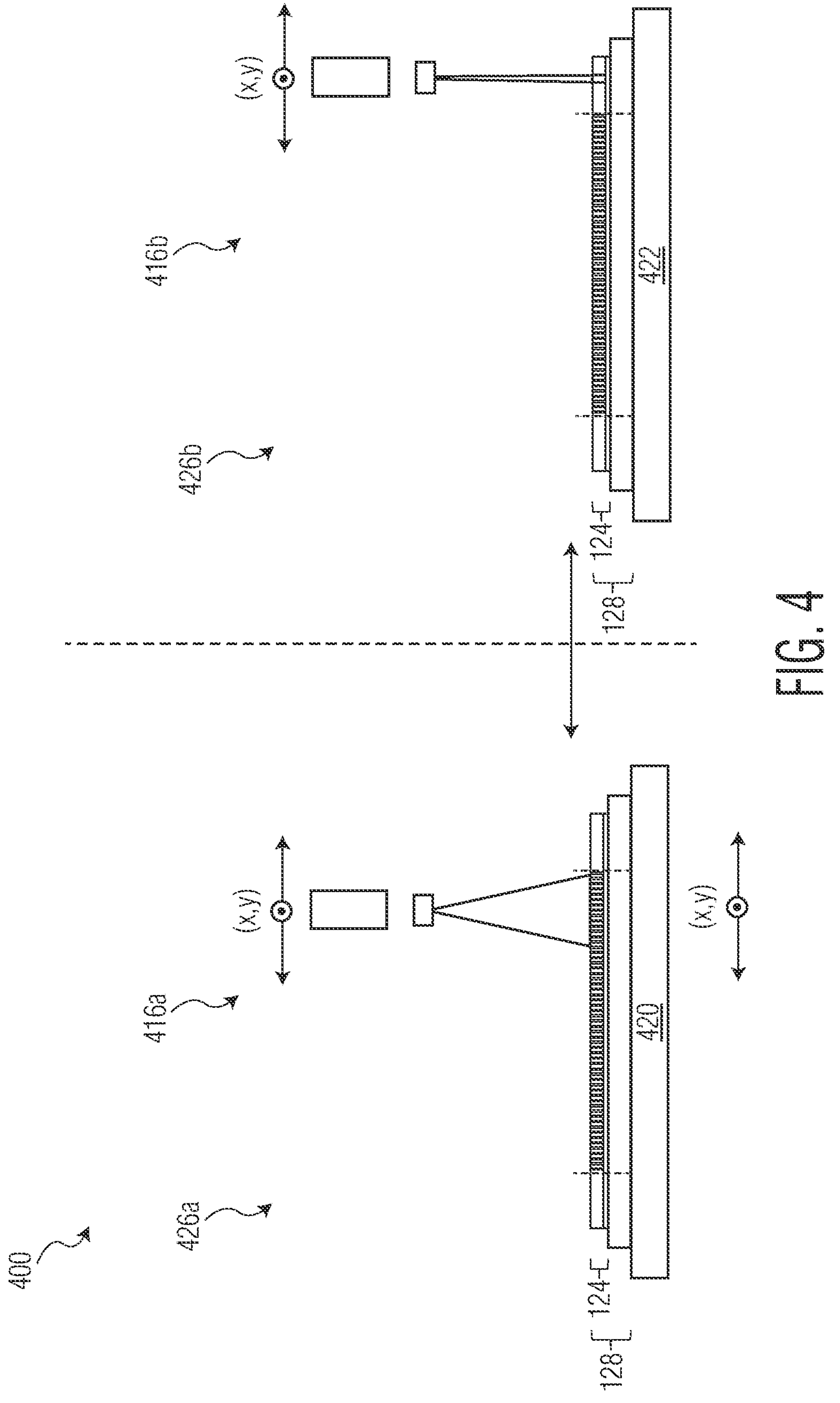
FIG. 4 is a block diagram side sectional view of a patterning system including a plurality of patterning subsystems in accordance with an exemplary embodiment of the invention.

Referring now to FIG. 4, patterning system 400 is illustrated having two patterning subsystems: patterning subsystem 426*a* and patterning subsystem 426*b*. Patterning subsystem 426*a* includes illumination system 416*a* (e.g., including a direct write illumination tool) for selectively illuminating the inner portion; patterning subsystem 426*b* includes illumination system 416*b* (e.g., including a direct write illumination tool) for selectively illuminating the edge portion. Workpiece assembly 128 is illustrated supported by support structure 420, 422 (which may be the same support structure 220, 320, or a different support structure). Workpiece assembly 128 is illustrated being transferred from patterning subsystem 426*a* to patterning subsystem 426*b*.

Figure 5:
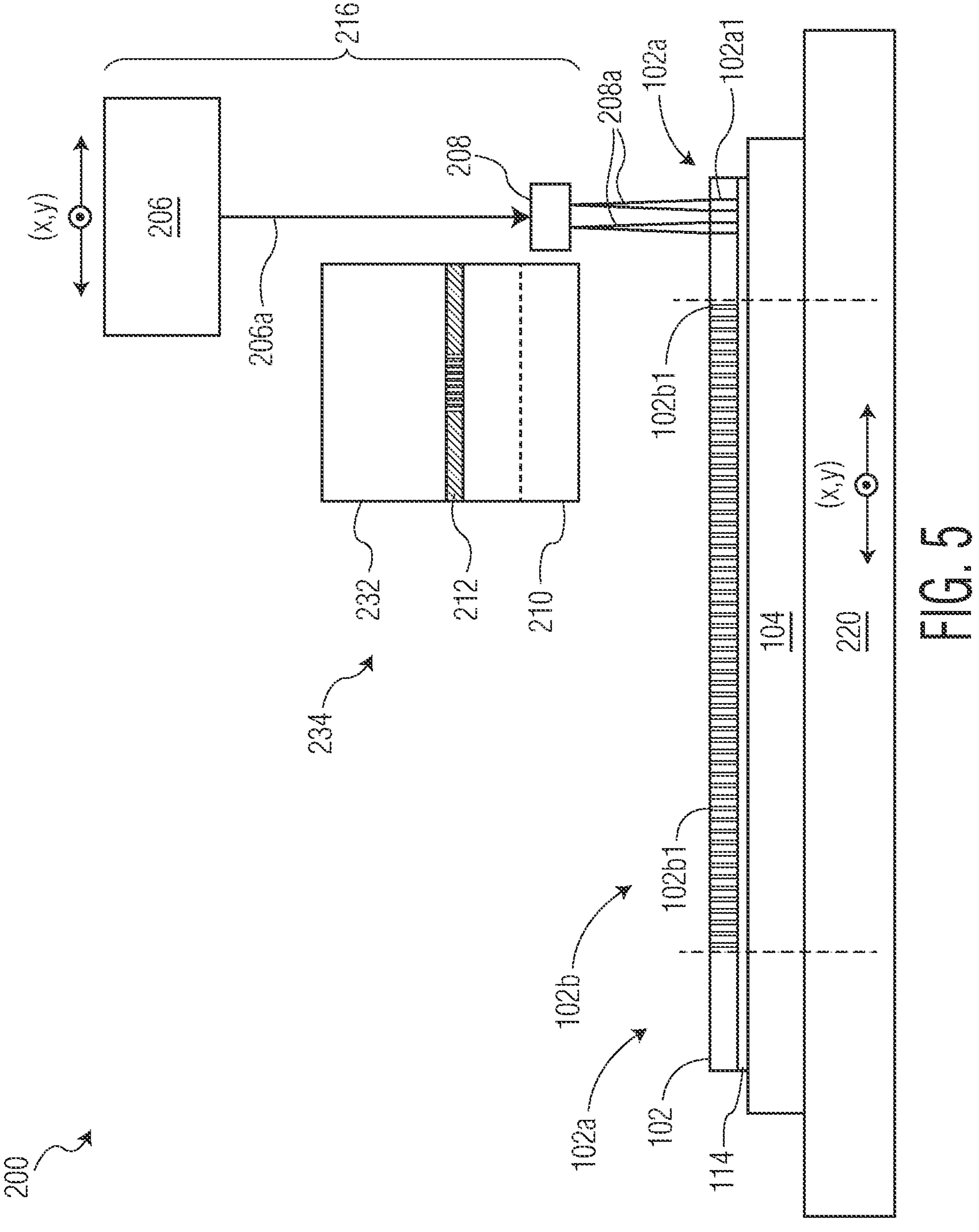
FIG. 5 is a block diagram side view of a patterning system including an illumination system using a plurality of spot light beams in accordance with an exemplary embodiment of the invention.

Referring now to FIG. 5, light source 206 is positioned above optical assembly 208 to form illumination system 216*b* (similar to the orientation shown in FIGS. 2C-2D). Illumination system 216*b* is positioned above edge portion 102*a* of photoresist 102. Light source 206 is illustrated transmitting light 206*a* to optical assembly 208. Illumination system 216*b* is illustrated transmitting a plurality of beams 208*a* (e.g., a plurality of spot light beams) to edge portion 102*a* of photoresist 102, thus forming patterned portion 102*a*1. Thus, illumination system 216*b* provides a plurality of spot light beams which are selectively turned on and off at different locations of edge portion 102*a* to form the edge patterned portion of photoresist 102.

Figure 6A:
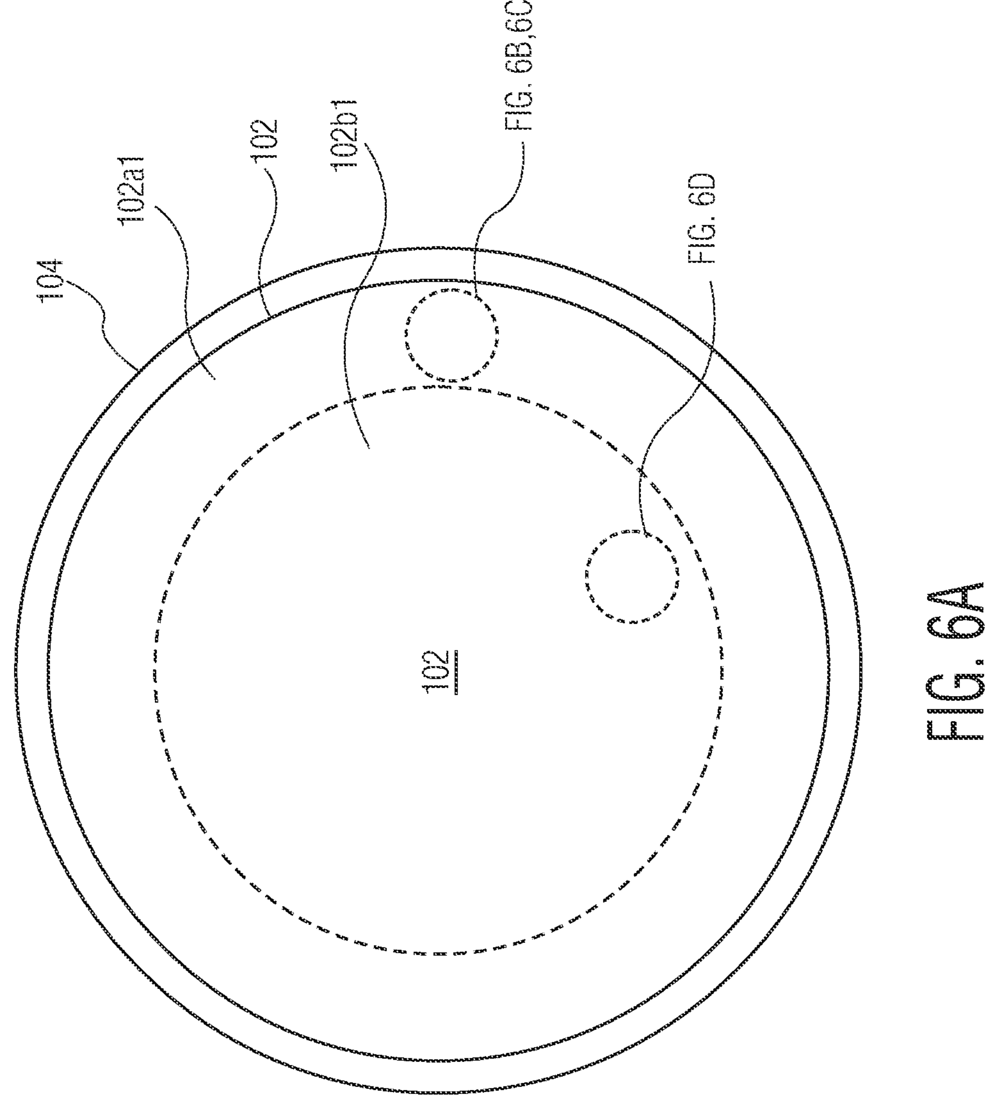
FIG. 6A is a top view of a patterned photoresist, illustrated with exemplary fill factors detailed in FIGS. 6B-6D, in accordance with various exemplary embodiments of the invention.
Figure 6D:
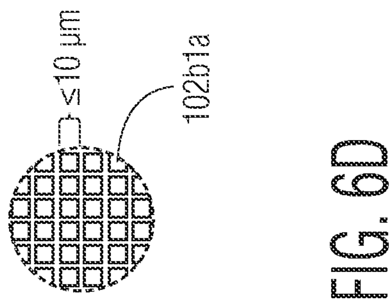
Figure 6C:
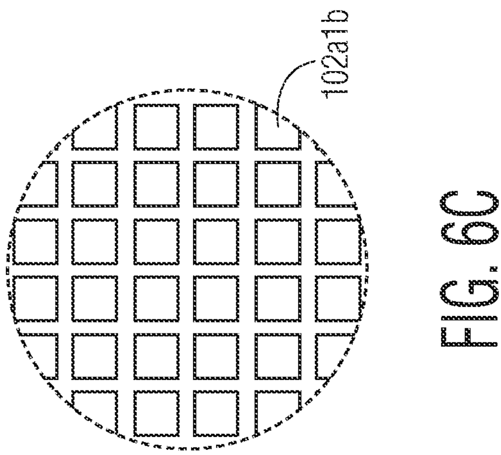
Figure 6B:
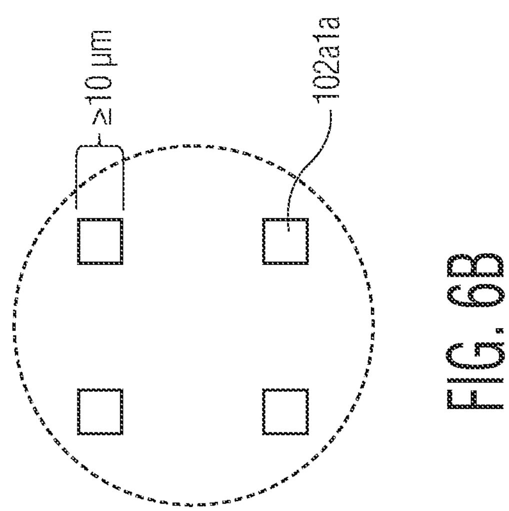

Referring now to FIG. 6A, photoresist 102 is illustrated after an illumination step (e.g., selective illumination). In the detail shown in FIG. 6B, patterned portion 102*a*1 of edge portion 102*a* is illustrated with a low fill factor (e.g., 5% fill factor) of patterned features 102*a*1*a* having a dimension of greater than (or equal to) 10 microns (but could also be greater than 20 microns, or greater than 50 microns, or other dimensions). In the detail shown in FIG. 6C, patterned portion 102*a*1 of edge portion 102*a* is illustrated with a high fill factor (e.g., 95% fill factor) patterned features 102*a*1*b*. In the detail shown in FIG. 6D, inner patterned portion 102*b*1 is illustrated with patterned features 102*b*1*a* having a dimension of less than (or equal to) 10 microns (it being understood that at least a portion of these features could be larger than 10 microns). As will be appreciated by those skilled in the art, these dimensions are in a lateral direction (e.g., a width of the patterned feature, a length of a patterned feature, a length and width of a patterned feature, etc.), as opposed to being in a vertical direction (e.g., a depth of the patterned feature).

Figures 7A, 7B, 7C:
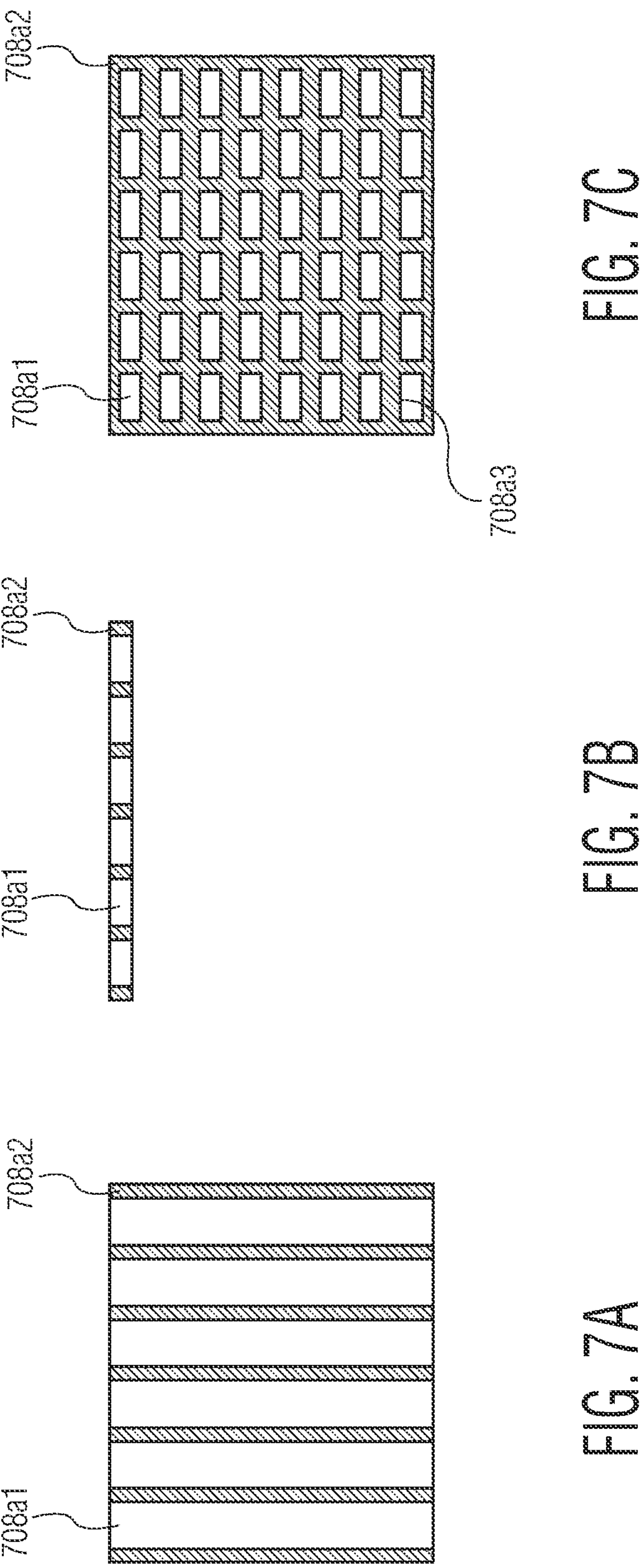
FIGS. 7A-7C illustrate illumination patterns in accordance with various exemplary embodiments of the invention.

Referring now to FIG. 7, various illumination patterns are illustrated. FIG. 7A illustrates a linear light pattern (e.g., created on a 2D spatial light modulator) projected to a substrate (e.g., at the wafer level). The pattern includes an illuminated portion 708*a*1 and an unilluminated portion 708*a*2. The light pattern (e.g., light intensity pattern) may be generated by a spatial light modulator. FIG. 7B illustrates a linear pattern projected on to a substrate. FIG. 7C illustrates an exposure pattern in a photoresist. An unilluminated portion 708*a*3 is created by scanning and pulsing (i.e., turning on and off) the illumination pattern.

Figure 8:
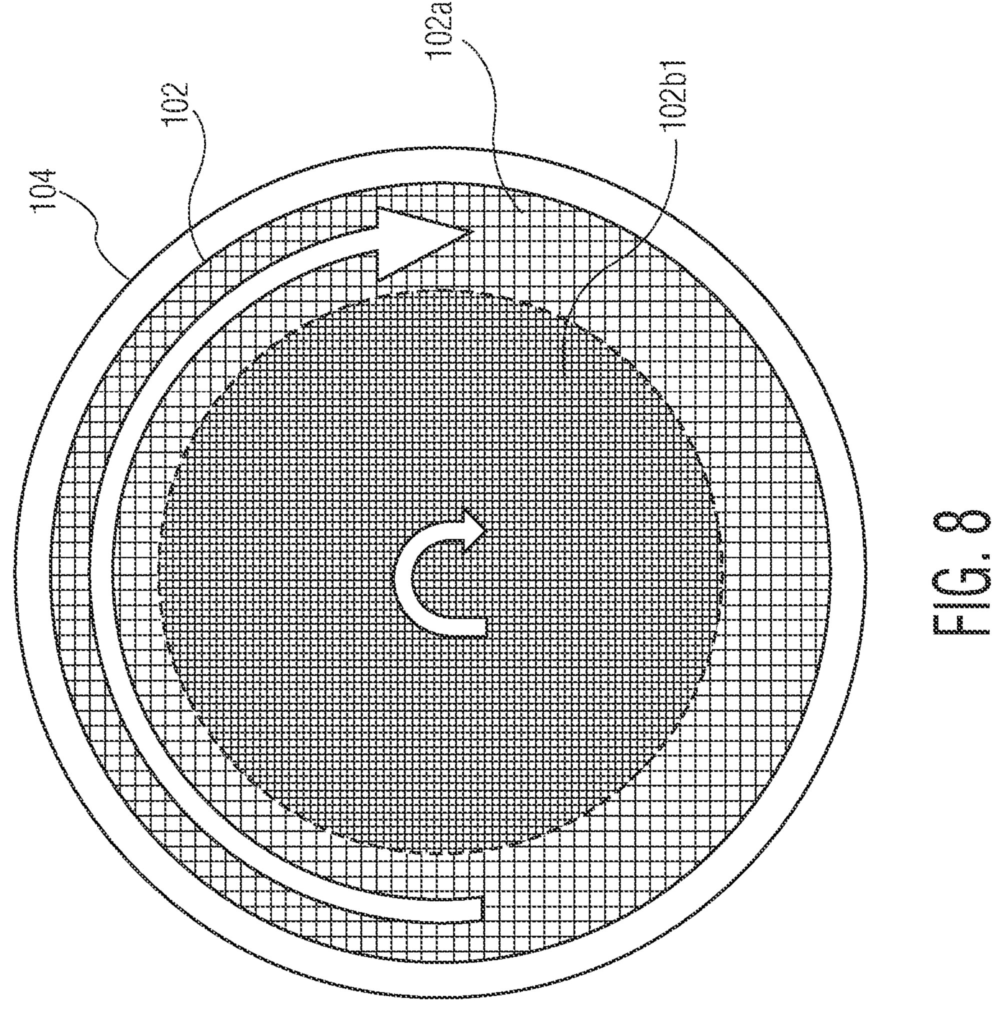
FIG. 8 is a top view of a photoresist patterned in accordance with an exemplary embodiment of the invention.

Referring now to FIG. 8, photoresist 102 is illustrated after an illumination step (e.g., selective illumination). The photoresist 102 is indicated having been selectively illuminated azimuthally (i.e., in a clockwise direction). An illumination system (not illustrated) may be moved azimuthally, a support structure (not illustrated) may move the photoresist 102 azimuthally, or a combination of movements.

Figure 9:
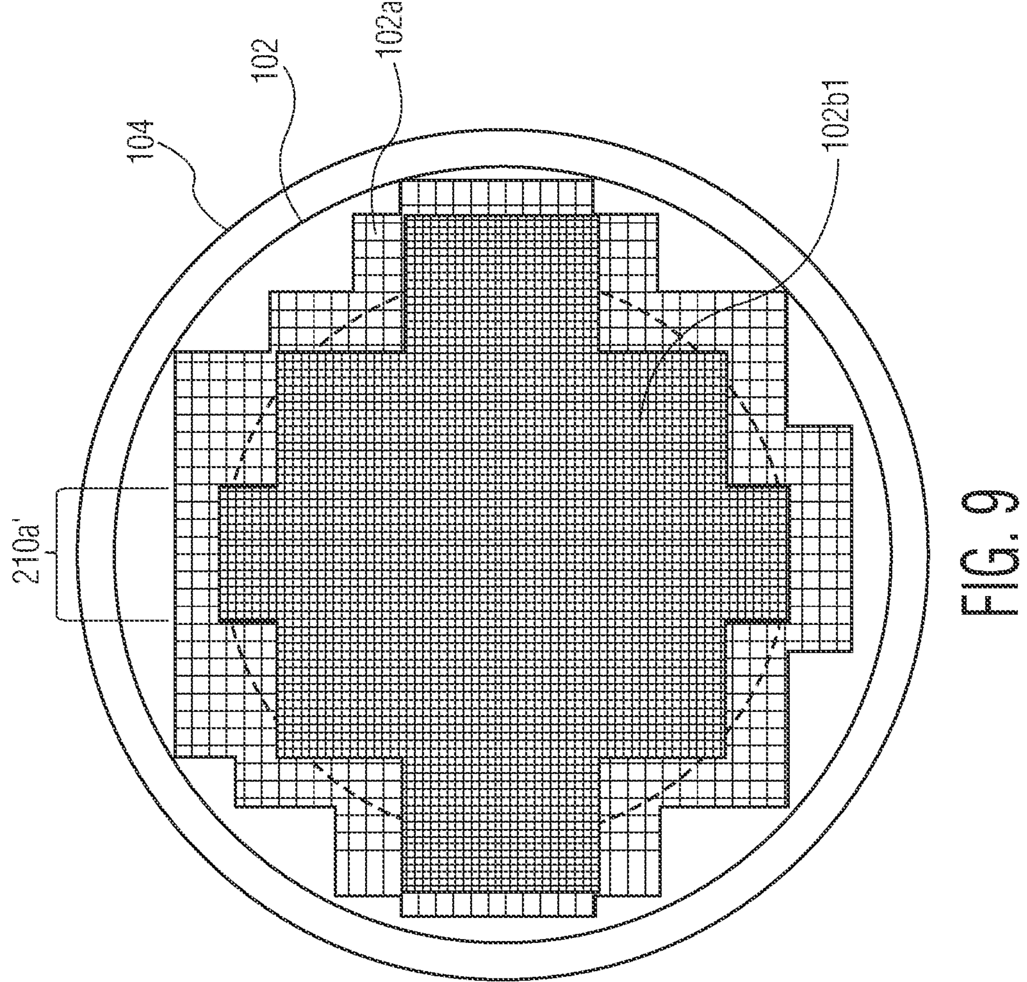
FIG. 9 is a top view of a photoresist patterned in accordance with an exemplary embodiment of the invention.

Referring now to FIG. 9, photoresist 102 is illustrated after an illumination step (e.g., selective illumination). The photoresist 102 is indicated having been selectively illuminated in a step wise manner and/or by linear scanning of an illumination system (not illustrated) or a support structure (not illustrated). The width of illumination field in the inner portion of photoresist (which can be one-dimensional in case of scanning or two-dimensional in case of stepping) is indicated as the illumination region 210*a'*.

Figure 10:
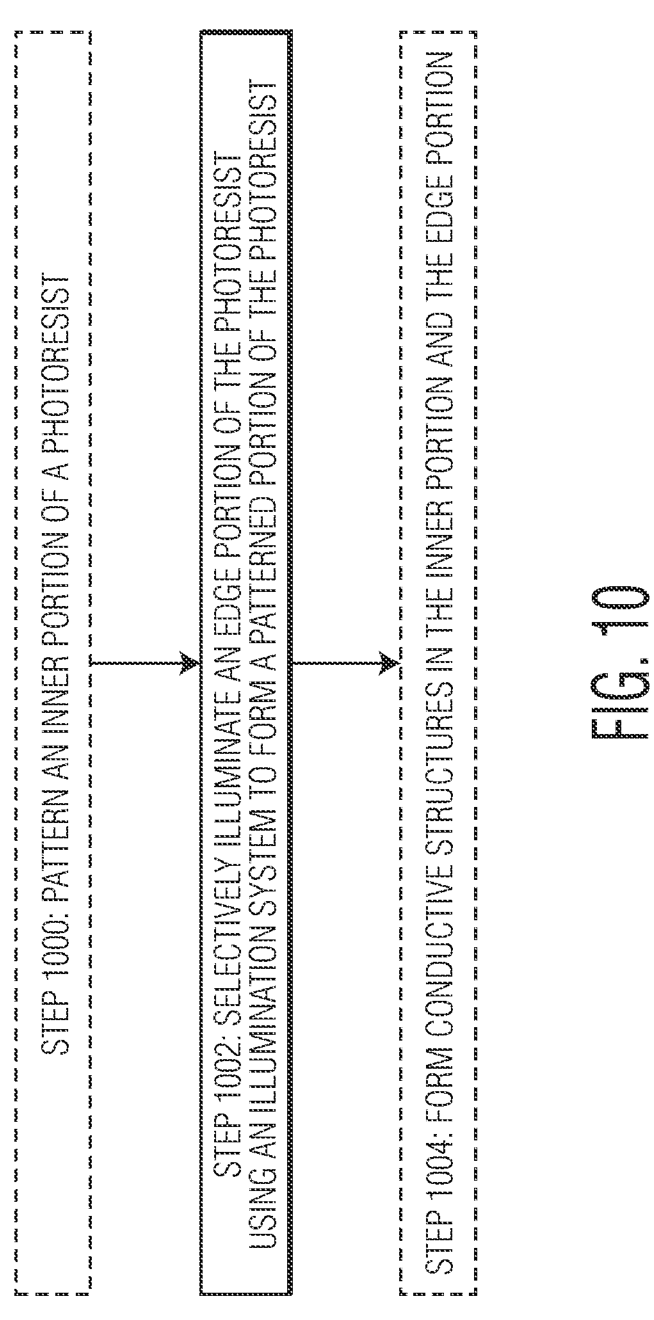
FIGS. 10-12 are flow diagrams illustrating methods of patterning a photoresist in accordance with an exemplary embodiment of the invention.

Referring now to FIG. 10, a method of patterning a photoresist is illustrated. At optional Step 1000, an inner portion of a photoresist is patterned. For example, the inner portion of the photoresist may be patterned by illuminating the inner portion (e.g., using a photomask, a direct write illumination tool, etc.). At Step 1002, an edge portion of the photoresist is selectively illuminated using an illumination system to form a patterned portion of the photoresist. For example, the step of selectively illuminating the edge portion of the photoresist may include using a spot light beam of the illumination system (or a plurality of spot light beams) (e.g., selectively turned on and off at different locations of the edge portion) to form the patterned portion of the photoresist.

In the various embodiments of the invention disclosed herein (including the embodiments shown in FIGS. 10-12), the illumination of the edge portion may be accomplished through a scanning process, for example, by moving the illumination system and/or a substrate supporting the photoresist. For example, the step of selectively illuminating the edge portion of the photoresist may include moving at least one of (i) the illumination system and (ii) a substrate supporting the photoresist to form the patterned portion of the photoresist. In another example, the step of selectively illuminating the edge portion of the photoresist may include using a plurality of spot light beams of the illumination system in a scanning process, wherein the scanning process includes moving at least one of (i) the illumination system and (ii) a substrate supporting the photoresist to form the patterned portion of the photoresist.

At optional Step 1004, conductive structures are formed (e.g., through electroplating or other techniques for forming conductive structures) in the inner portion and the edge portion (e.g., where the edge portion surrounds the inner portion). For example, the conductive structures formed in the inner portion correspond to an active area of a semiconductor element, and the conductive structures formed in the edge portion correspond to an inactive area of a semiconductor element.

While not shown in FIG. 10, additional steps are contemplated as disclosed within the present document. For example, a step of illuminating an inner portion of the photoresist using another illumination system to form an inner patterned portion is contemplated (where such step of illuminating the inner portion may be done before or after Step 1002). As disclosed herein, the illumination systems may share a common light source (e.g., see FIGS. 2A-2D), or may have distinct light sources (e.g., FIG. 3).

Figure 11:
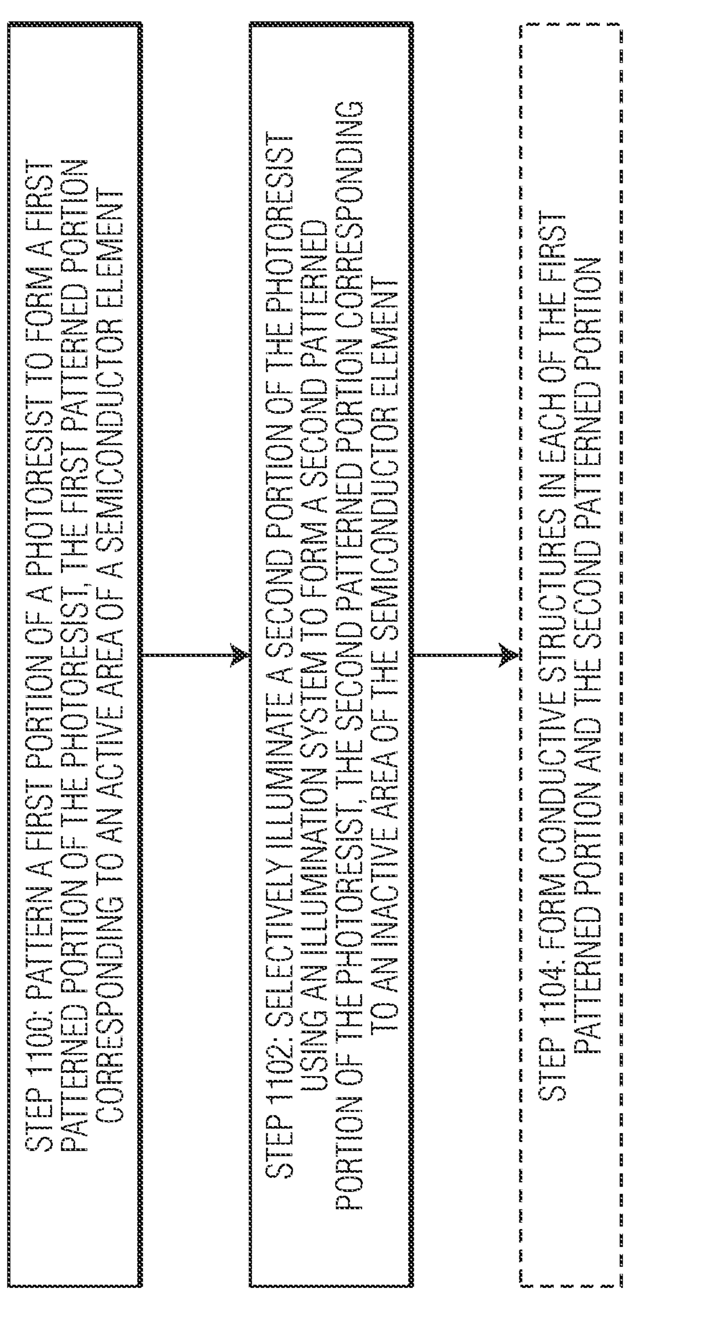

Referring now to FIG. 11, another method of patterning a photoresist is illustrated. At Step 1100, a first portion of a photoresist (e.g., an inner portion of the photoresist) is patterned (e.g., using a photomask, using an illumination source, and/or other techniques within the scope of the invention) to form a first patterned portion of the photoresist, the first patterned portion corresponding to an active area of a semiconductor element. At Step 1102, a second portion of the photoresist (e.g., an edge portion of the photoresist surrounding the inner portion) is selectively illuminated using an illumination system to form a second patterned portion of the photoresist, the second patterned portion corresponding to an inactive area of the semiconductor element. For example, the step of selectively illuminating the second portion of the photoresist may include using a spot light beam of the illumination system (or a plurality of spot light beams) (e.g., selectively turned on and off at different locations of the edge portion) to form the second patterned portion of the photoresist.

If the first patterned portion of the photoresist is formed at Step 1100 using another illumination system (different from the illumination system used to form the second patterned portion at Step 1102), the illumination systems may share a common light source (e.g., see FIGS. 2A-2D), or may have distinct light sources (e.g., FIG. 3).

At optional Step 1104, conductive structures are formed in each of the first patterned portion and the second patterned portion (e.g., through electroplating or other techniques for forming conductive structures).

Figure 12:
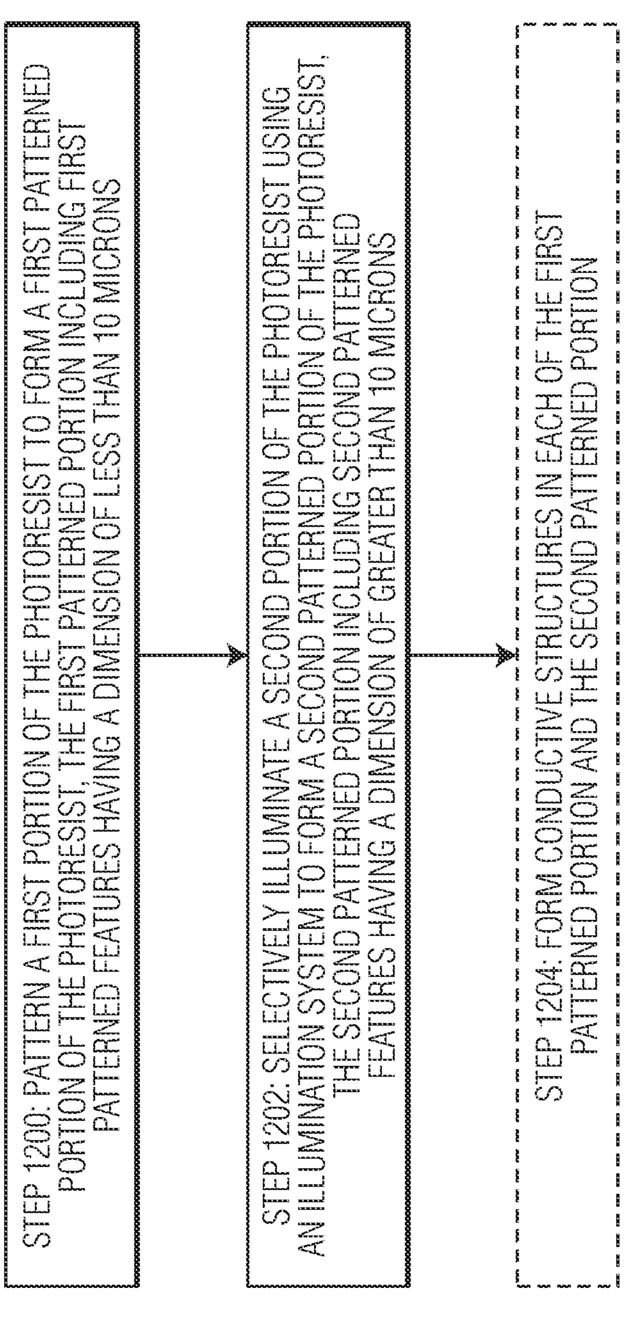

Referring now to FIG. 12, yet another method of patterning a photoresist is illustrated. At Step 1200, a first portion of the photoresist (e.g., an inner portion of the photoresist) is patterned (e.g., using a photomask, using an illumination source, and/or other techniques within the scope of the invention) to form a first patterned portion of the photoresist, the first patterned portion including first patterned features having a dimension of less than 10 microns. At Step 1202, a second portion of the photoresist (e.g., an edge portion of the photoresist surrounding the first portion of the photoresist) is selectively illuminated using an illumination system to form a second patterned portion of the photoresist, the second patterned portion including second patterned features having a dimension of greater than 10 microns (or greater than 20 microns, or greater than 50 microns, or other dimensions). For example, the step of selectively illuminating the second portion of the photoresist may include using a spot light beam of the illumination system (or a plurality of spot light beams) (e.g., selectively turned on and off at different locations of the edge portion) to form the second patterned portion of the photoresist.

If the first patterned portion of the photoresist is formed at Step 1200 using another illumination system (different from the illumination system used to form the second patterned portion at Step 1202), the illumination systems may share a common light source (e.g., see FIGS. 2A-2D), or may have distinct light sources (e.g., FIG. 3).

At optional Step 1204, conductive structures are formed (e.g., through electroplating or other techniques for forming conductive structures) in each of the first patterned portion and the second patterned portion.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of patterning a photoresist, the method comprising:

illuminating an inner portion of the photoresist to form a first patterned portion of the photoresist, the first patterned portion corresponding to an active area of a semiconductor element configured to be used for one or more semiconductor devices for the semiconductor element; and selectively illuminating an edge portion of a photoresist using an illumination system to form a second patterned portion of the photoresist, the second patterned portion corresponding to an inactive area of the semiconductor element configured not to be used for one or more semiconductor devices for the semiconductor element.

2. The method of claim 1 further comprising forming conductive structures in the edge portion.

3. The method of claim 2 wherein the conductive structures formed in the edge portion correspond to the inactive area of a semiconductor element.

4. The method of claim 1 wherein the edge portion of the photoresist surrounds an inner portion of the photoresist.

5. The method of claim 1 further comprising of illuminating an inner portion of the photoresist using another illumination system to form an inner patterned portion.

6. The method of claim 5 wherein the illumination system and the another illumination system share a light source.

7. The method of claim 1 further comprising patterning an inner portion of the photoresist by illuminating the inner portion of the photoresist.

8. The method of claim 1 further comprising patterning an inner portion of the photoresist by illuminating the inner portion of the photoresist using at least one of (a) a photomask and (b) a direct write illumination tool.

9. The method of claim 1 further comprising, before selectively illuminating the edge portion, patterning an inner portion of the photoresist by illuminating the inner portion of the photoresist using a photomask, the edge portion being masked during the step of patterning the inner portion.

10. The method of claim 1 wherein selectively illuminating the edge portion of the photoresist includes using a spot light beam of the illumination system which is selectively turned on and off at different locations of the edge portion of the photoresist to form the patterned portion of the photoresist.

11. The method of claim 1 wherein selectively illuminating the edge portion of the photoresist includes scanning using the illumination system with respect to the edge portion of the photoresist, wherein the scanning includes moving at least one of (i) the illumination system and (ii) a substrate supporting the photoresist to form the patterned portion of the photoresist.

12. The method of claim 1 wherein selectively illuminating the edge portion of the photoresist includes using a plurality of spot light beams of the illumination system which are selectively turned on and off at different locations of the edge portion of the photoresist to form the patterned portion of the photoresist.

13. The method of claim 12 wherein the plurality of spot light beams are created using at least one of an active optical assembly and a passive optical assembly.

14. The method of claim 1 wherein selectively illuminating the edge portion of the photoresist includes using a plurality of spot light beams of the illumination system in a scanning process, wherein the scanning process includes moving at least one of (i) the illumination system and (ii) a substrate supporting the photoresist to form the patterned portion of the photoresist.

15. A method of patterning a photoresist, the method comprising:

(a) patterning a first portion of a photoresist to form a first patterned portion of the photoresist, the first patterned portion corresponding to an active area of a semiconductor element configured to be used for one or more semiconductor devices for the semiconductor element; and (b) selectively illuminating a second portion of the photoresist using an illumination system to form a second patterned portion of the photoresist, the second patterned portion corresponding to an inactive area of the semiconductor element configured not to be used for one or more semiconductor devices for the semiconductor element.

16. The method of claim 15 further comprising (c) forming conductive structures in each of the first patterned portion and the second patterned portion.

17. The method of claim 15 wherein the first portion of the photoresist includes an inner portion of the photoresist, and wherein the second portion of the photoresist includes an edge portion of the photoresist surrounding the inner portion of the photoresist.

18. The method of claim 15 wherein step (a) includes patterning the first portion of the photoresist by illuminating the first portion of the photoresist using a photomask.

19. The method of claim 15 wherein step (b) includes selectively illuminating the second portion of the photoresist using a spot light beam of the illumination system which is selectively turned on and off at different locations of the second portion of the photoresist to form the second patterned portion of the photoresist.

20. The method of claim 15 wherein step (b) includes selectively illuminating the second portion of the photoresist by moving at least one of (i) the illumination system with respect to the photoresist, and (ii) a substrate supporting the photoresist with respect to the illumination system.

21. The method of claim 15 wherein step (b) includes selectively illuminating the second portion of the photoresist using a plurality of spot light beams of the illumination system which are selectively turned on and off at different locations of the second portion of the photoresist to form the second patterned portion of the photoresist.

22. The method of claim 15 wherein the first patterned portion of the photoresist is formed using another illumination system different from the illumination system, wherein the illumination system and the another illumination system share a light source.

23. A method of patterning a photoresist, the method comprising:

(a) patterning a first portion of the photoresist to form a first patterned portion of the photoresist, the first patterned portion including first patterned features having a dimension of less than 10 microns, the first patterned portion corresponding to an active area of a semiconductor element configured to be used for one or more semiconductor devices for the semiconductor element; and (b) selectively illuminating a second portion of the photoresist using an illumination system to form a second patterned portion of the photoresist, the second patterned portion including second patterned features having a dimension of greater than 10 microns, the second patterned portion corresponding to an inactive area of the semiconductor element configured not to be used for one or more semiconductor devices for the semiconductor element.

24. The method of claim 23 further comprising (c) forming conductive structures in each of the first patterned portion and the second patterned portion.

25. The method of claim 23 wherein the first portion of the photoresist includes an inner portion of the photoresist, and wherein the second portion of the photoresist includes an edge portion of the photoresist surrounding the inner portion of the photoresist.

26. The method of claim 23 wherein step (a) includes patterning the first portion of the photoresist by illuminating the first portion of the photoresist using a photomask.

27. The method of claim 23 wherein step (b) includes selectively illuminating the second portion of the photoresist using a spot light beam of the illumination system which is selectively turned on and off at different locations of the second portion of the photoresist to form the second patterned portion of the photoresist.

28. The method of claim 23 wherein step (b) includes selectively illuminating the second portion of the photoresist by moving at least one of (i) the illumination system with respect to the photoresist, and (ii) a substrate supporting the photoresist with respect to the illumination system.

29. The method of claim 23 wherein step (b) includes selectively illuminating the second portion of the photoresist using a plurality of spot light beams of the illumination system which are selectively turned on and off at different locations of the second portion of the photoresist to form the second patterned portion of the photoresist.

30. The method of claim 23 wherein the first patterned portion of the photoresist is formed using another illumination system different from the illumination system, wherein the illumination system and the another illumination system share a light source.

31. The method of claim 23 wherein step (b) includes selectively illuminating the second portion of the photoresist such that the second patterned portion including the second patterned features having a dimension of greater than 20 microns.

32. The method of claim 23 wherein step (b) includes selectively illuminating the second portion of the photoresist such that the second patterned portion including the second patterned features having a dimension of greater than 50 microns.

* * * * *